(12) United States Patent
Wang et al.

(10) Patent No.: US 11,973,023 B2
(45) Date of Patent: Apr. 30, 2024

(54) STACKED VIA STRUCTURE

(71) Applicant: Taiwan Semiconductor Manufacturing Company, Ltd., Hsinchu (TW)

(72) Inventors: Po-Han Wang, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 17/165,954

(22) Filed: Feb. 3, 2021

(65) Prior Publication Data

US 2021/0159171 A1 May 27, 2021

Related U.S. Application Data

(60) Continuation of application No. 16/936,436, filed on Jul. 23, 2020, now Pat. No. 11,393,749, which is a
(Continued)

(51) Int. Cl.
*H01L 23/522* (2006.01)
*H01L 21/56* (2006.01)
(Continued)

(52) U.S. Cl.
CPC ........ *H01L 23/5226* (2013.01); *H01L 21/561* (2013.01); *H01L 21/568* (2013.01); *H01L 21/6835* (2013.01); *H01L 21/7684* (2013.01); *H01L 21/76871* (2013.01); *H01L 21/76885* (2013.01); *H01L 21/78* (2013.01); *H01L 22/32* (2013.01); *H01L 23/3114* (2013.01); *H01L 23/49827* (2013.01); *H01L 23/5389* (2013.01); *H01L 24/03* (2013.01); *H01L 24/06* (2013.01);
(Continued)

(58) Field of Classification Search
CPC ... H01L 2224/023–024; H01L 23/5226; H01L 23/49827
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Laura M Menz
*Assistant Examiner* — Candice Chan
(74) *Attorney, Agent, or Firm* — JCIPRNET

(57) ABSTRACT

A stacked via structure including a first dielectric layer, a first conductive via, a first redistribution wiring, a second dielectric layer and a second conductive via is provided. The first dielectric layer includes a first via opening. The first conductive via is in the first via opening. A first level height offset is between a top surface of the first conductive via and a top surface of the first dielectric layer. The first redistribution wiring covers the top surface of the first conductive via and the top surface of the first dielectric layer. The second dielectric layer is disposed on the first dielectric layer and the first redistribution wiring. The second dielectric layer includes a second via opening. The second conductive via is in the second via opening. The second conductive via is electrically connected to the first redistribution wiring through the second via opening of the second dielectric layer.

20 Claims, 23 Drawing Sheets

Related U.S. Application Data division of application No. 15/879,457, filed on Jan. 25, 2018, now Pat. No. 10,763,206.

(60) Provisional application No. 62/578,536, filed on Oct. 30, 2017.

(51) Int. Cl.
　　*H01L 21/66* (2006.01)
　　*H01L 21/683* (2006.01)
　　*H01L 21/768* (2006.01)
　　*H01L 21/78* (2006.01)
　　*H01L 23/00* (2006.01)
　　*H01L 23/31* (2006.01)
　　*H01L 23/498* (2006.01)
　　*H01L 23/538* (2006.01)

(52) U.S. Cl.
　　CPC .............. *H01L 24/19* (2013.01); *H01L 24/20* (2013.01); *H01L 24/97* (2013.01); *H01L 2221/68359* (2013.01); *H01L 2221/68372* (2013.01); *H01L 2224/0231* (2013.01); *H01L 2224/02331* (2013.01); *H01L 2224/02379* (2013.01); *H01L 2224/02381* (2013.01); *H01L 2224/18* (2013.01); *H01L 2224/73267* (2013.01); *H01L 2924/00014* (2013.01); *H01L 2924/1203* (2013.01); *H01L 2924/1304* (2013.01); *H01L 2924/37001* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0271283 A1* | 9/2017 | Lee .................. H01L 24/11 |

* cited by examiner

STACKED VIA STRUCTURE

CROSS-REFERENCE TO RELATED APPLICATION

This application is a continuation application of U.S. application Ser. No. 16/936,436, filed on Jul. 23, 2020. This U.S. application Ser. No. 16/936,436 is a divisional application of and claims the priority benefit of U.S. application Ser. No. 15/879,457, filed on Jan. 25, 2018, now allowed, which claims the priority benefit of U.S. provisional application Ser. No. 62/578,536, filed on Oct. 30, 2017. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
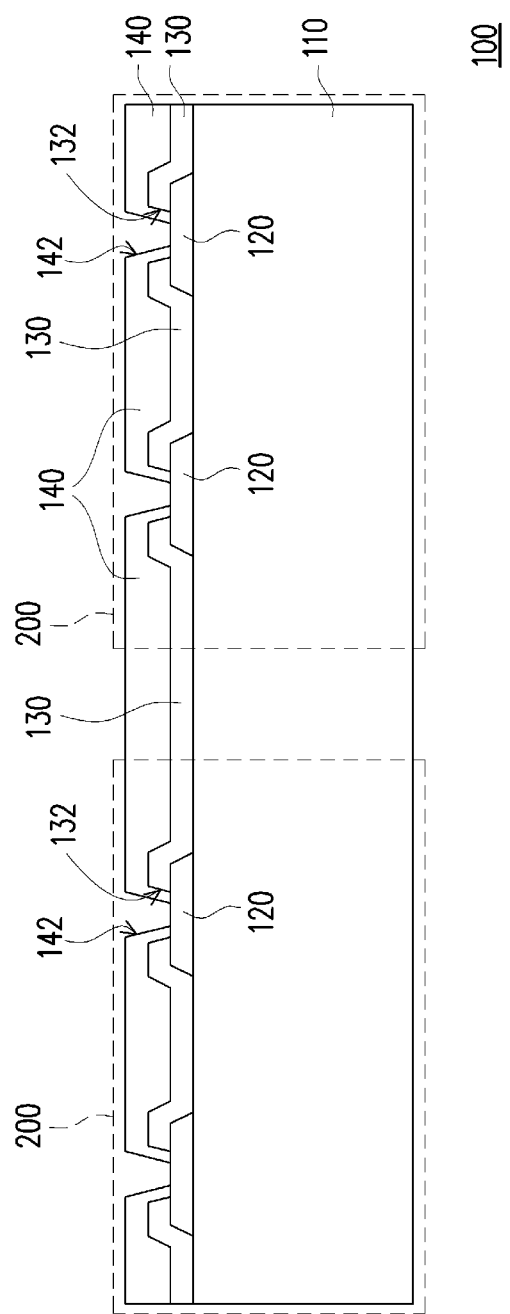
FIGS. 1 through 21 illustrate a process flow for fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 21 illustrate a process flow for fabricating an integrated fan-out package in accordance with some embodiments of the present disclosure.

Referring to FIG. 1, a wafer 100 including a plurality of semiconductor dies or integrated circuit components 200 arranged in an array is provided. Before a wafer dicing process is performed on the wafer 100, the integrated circuit components 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
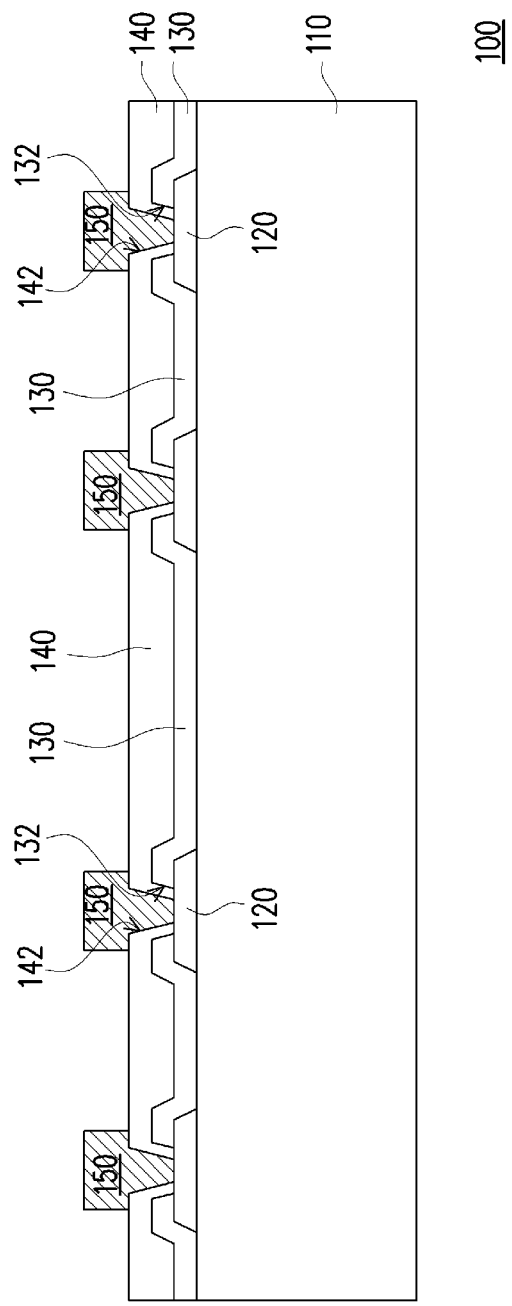

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example. In some embodiments, the conductive pillars 150 are plated copper pillars.

Figure 3:
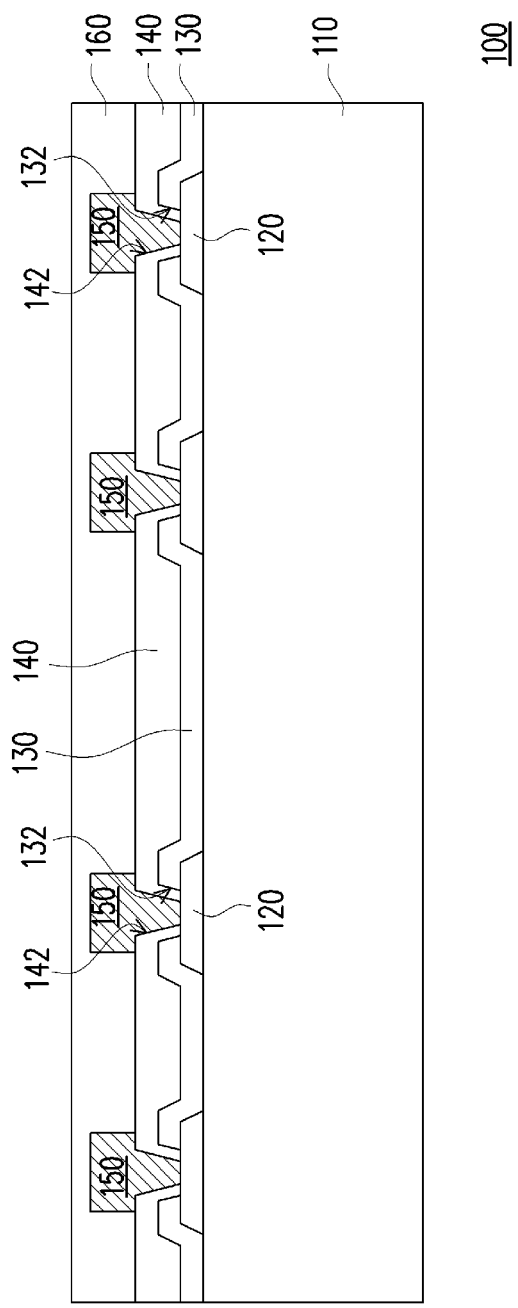

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
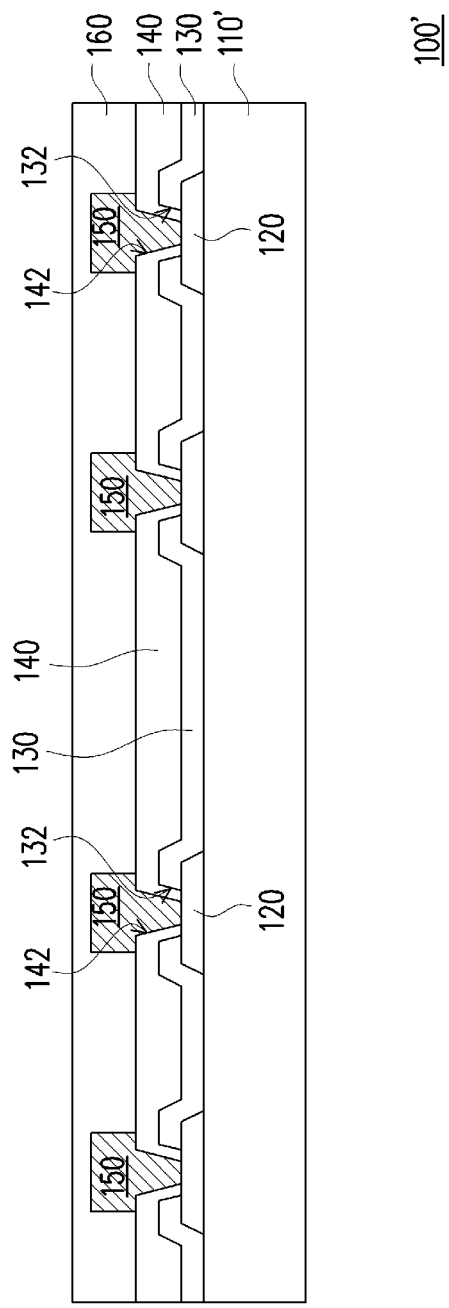

Referring to FIG. 4, a back side grinding process is performed on the rear surface of the wafer 100 after the protection layer 160 is formed. During the back side grinding process, the semiconductor substrate 110 is ground such that a thinned wafer 100' including a thinned semiconductor substrate 110' is formed.

Figure 5:
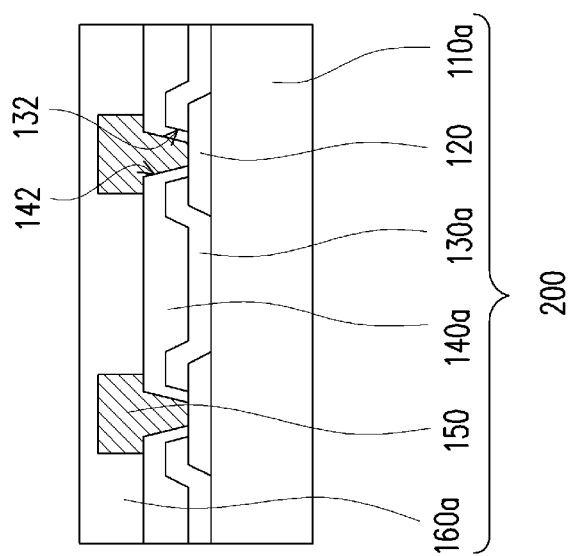
Figure 5:
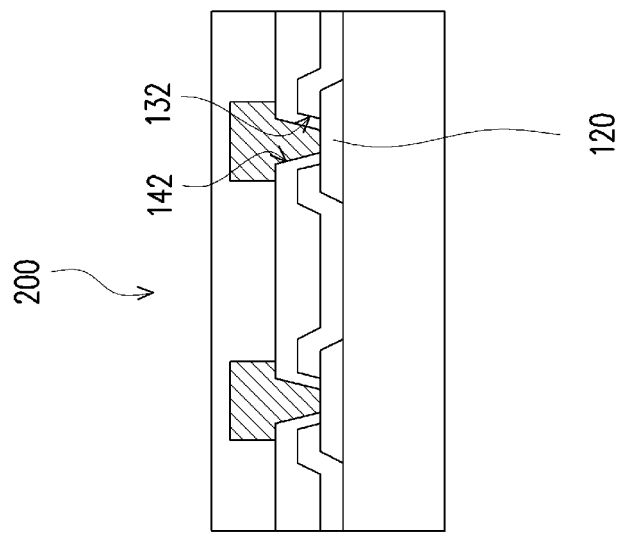

Referring to FIG. 5, after performing the back side grinding process, a wafer dicing process is performed on the thinned wafer 100' such that the integrated circuit components 200 in the wafer 100' are singulated from one another. Each of the singulated integrated circuit components 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding and the wafer dicing processes, the protection layer 160 and 160a may well protect the conductive pillars 150 of the integrated circuit components 200. In addition, the conductive pillars 150 of the integrated circuit components 200 may be protected from being damaged by sequentially performed processes, such as pick-up and placing process of the integrated circuit components 200, molding process, and so on.

Figure 6:
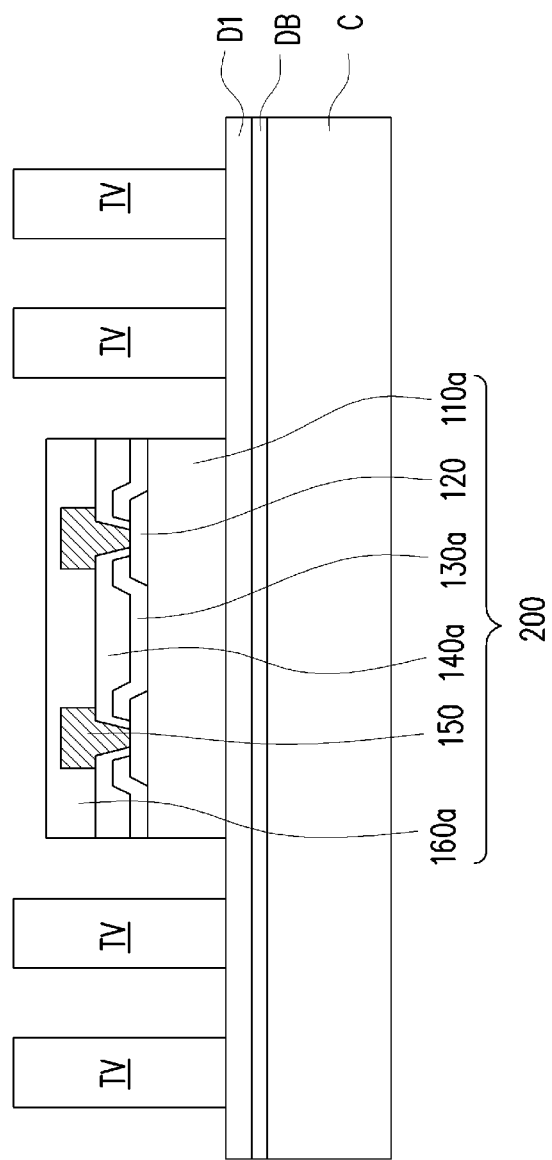

Referring to FIG. 6, after the integrated circuit components 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

After the carrier C having the de-bonding layer DB and the dielectric layer DI formed thereon is provided, a plurality of conductive through vias TV are formed on the dielectric layer DI. In some embodiments, the plurality of conductive through vias TV is formed by photoresist coating, photolithography, plating, and photoresist stripping process. For example, the conductive through vias TV include copper posts or other suitable metal post.

As shown in FIG. 6, in some embodiments, one of the integrated circuit components 200 including the conductive pads 120, the conductive pillars 150, and a protection layer 160a formed thereon is picked and placed on the dielectric layer DI. The integrated circuit components 200 is attached or adhered on the dielectric layer DI through a die attach film (DAF), an adhesion paste or the like. In some alternative embodiments, more than one of the integrated circuit components 200 are picked and placed on the dielectric layer DI, wherein the integrated circuit components 200 placed on the dielectric layer DI may be arranged in an array. When the integrated circuit components 200 placed on the dielectric layer DI are arranged in an array, the conductive through vias TV may be classified into groups. The number of the integrated circuit components 200 is corresponding to the number of the groups of the conductive through vias TV.

As shown in FIG. 6, the top surface of the protection layer 160a is lower than the top surfaces of the conductive through vias TV, and the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

As shown in FIG. 6, the integrated circuit component 200 is picked and placed on the dielectric layer DI after the formation of the conductive through vias TV. However, the disclosure is not limited thereto. In some alternative embodiments, the integrated circuit component 200 is picked and placed on the dielectric layer DI before the formation of the conductive through vias TV.

Figure 7:
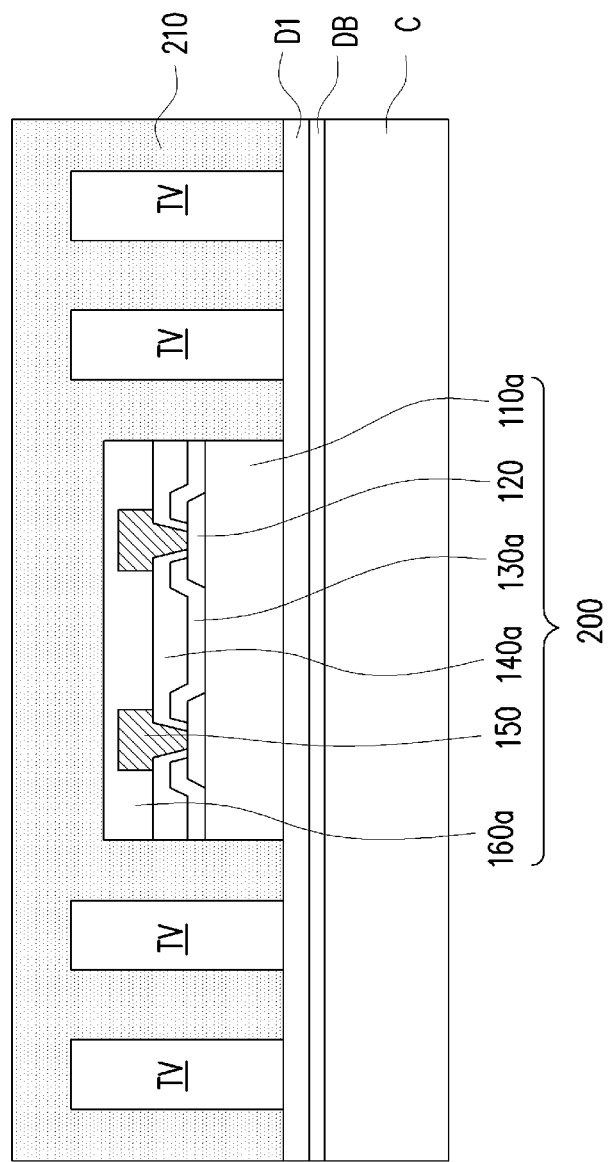

Referring to FIG. 7, an insulating material 210 is formed on the dielectric layer DI to cover the integrated circuit component 200 and the conductive through vias TV. In some embodiments, the insulating material 210 is a molding compound formed by a molding process. The conductive pillars 150 and the protection layer 160a of the integrated circuit component 200 are covered by the insulating material 210. In other words, the conductive pillars 150 and the protection layer 160a of the integrated circuit component 200 are not revealed and are well protected by the insulating material 210. In some embodiments, the insulating material 210 includes epoxy or other suitable dielectric materials.

Figure 8:
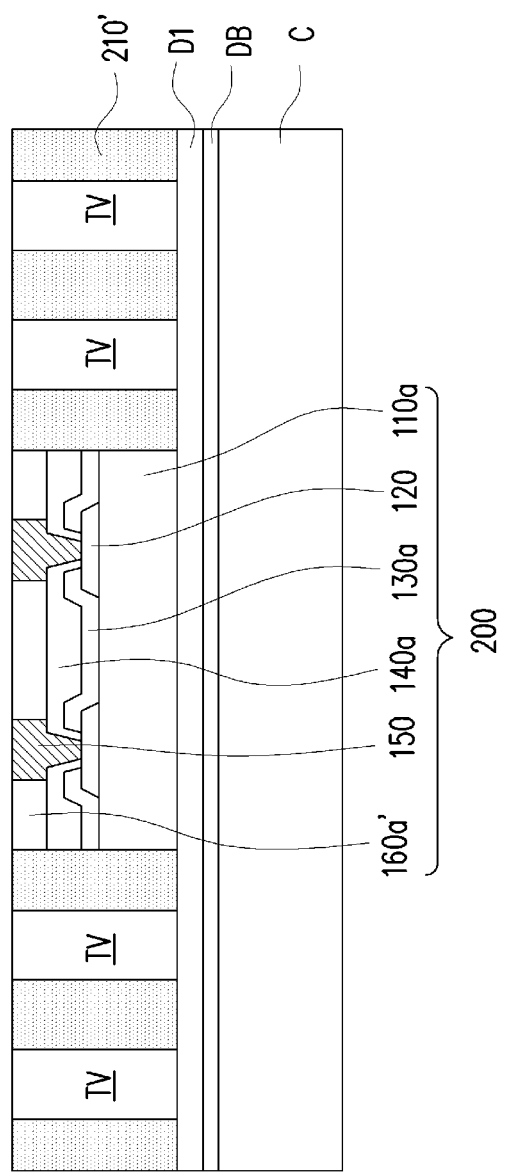

Referring to FIG. 8, the insulating material 210 is then ground until the top surfaces of the conductive pillars or conductive pillars 150, the top surfaces of the conductive through vias TV, and the top surface of the protection layer 160a are exposed. In some embodiments, the insulating material 210 is ground by a mechanical grinding process and/or a chemical mechanical polishing (CMP) process. After the insulating material 210 is ground, an insulating encapsulation 210' is formed over the dielectric layer DI. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are ground also.

As shown in FIG. 8, the insulating encapsulation 210' encapsulates the sidewalls of the integrated circuit component 200, and the insulating encapsulation 210' is penetrated by the conductive through vias TV. In other words, the integrated circuit component 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

After forming the insulating encapsulation 210' and the protection layer 160a', a redistribution circuit structure electrically connected to the conductive pillars 150 of the integrated circuit component 200 is then formed on the top surfaces of the conductive through vias TV, the top surface of the insulating encapsulation 210', the top surfaces of the conductive pillars 150, and the top surface of the protection layer 160a'. The redistribution circuit structure is fabricated to electrically connect with one or more connectors underneath. Here, the afore-said connectors may be the conductive pillars 150 of the integrated circuit component 200 and/or the conductive through vias TV embedded in the insulating encapsulation 210'. The redistribution circuit structure is described in accompany with FIGS. 9 through 22 in detail.

Figure 9:
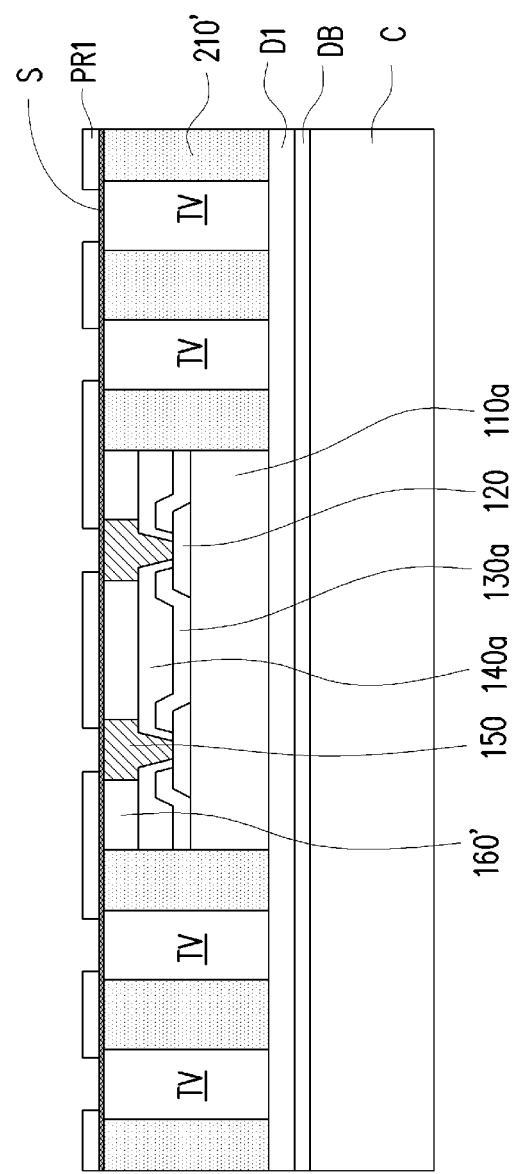

Referring to FIG. 9, a bottom seed layer S is formed on the top surfaces of the conductive through vias TV, the top surface of the insulating encapsulation 210', the top surfaces of the conductive pillars 150, and the top surface of the protection layer 160a'. In some embodiments, the bottom seed layer S may be a titanium layer formed by a sputtering process and the thickness of the bottom seed layer S may be about 5 angstroms. A patterned photoresist layer PR1 is then formed over the bottom seed layer S through photolithography and development processes. The patterned photoresist layer PR1 includes a plurality of openings for exposing portions of the bottom seed layer S that are corresponding to the conductive pillars 150 and the conductive through vias TV.

Figure 10:
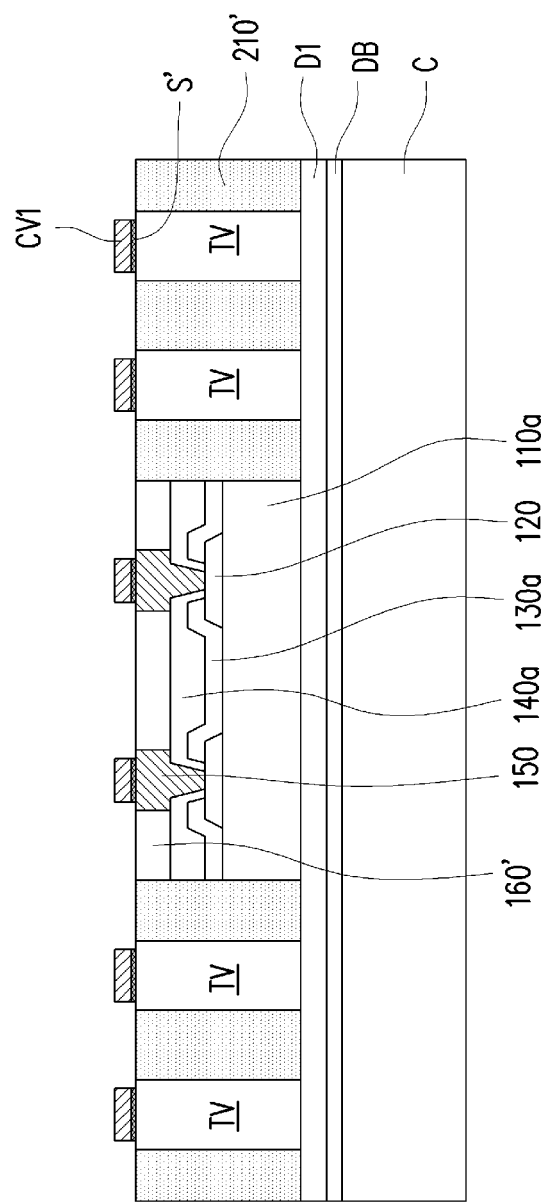

Referring to FIG. 9 and FIG. 10, a plating process is performed such that a plurality of first conductive vias CV1 are formed in the openings defined in the patterned photoresist layer PR1. In some embodiments, the first conductive vias CV1 may be copper vias and the thickness of the first conductive vias CV1 may be about 20 angstroms. Since the patterned photoresist layer PR1 is formed through photolithography and development processes, the critical dimension of the openings defined in the patterned photoresist layer PR1 may be less than 5 micrometers. Accordingly, the critical dimension of the first conductive vias CV1 formed in the openings of the patterned photoresist layer PR1 may be less than 5 micrometers.

After the first conductive vias CV1 are formed, the patterned photoresist layer PR1 is removed. Thereafter, by using the first conductive vias CV1 as a hard mask, portions of the bottom seed layer S that are not covered by the first conductive vias CV1 are removed such that a bottom patterned seed layer S' covered by the first conductive vias CV1 is formed on the conductive pillars 150 and the conductive through vias TV. In some embodiments, the bottom seed layer S may be patterned through an etch process so as to form the bottom patterned seed layer S'.

Figure 11:
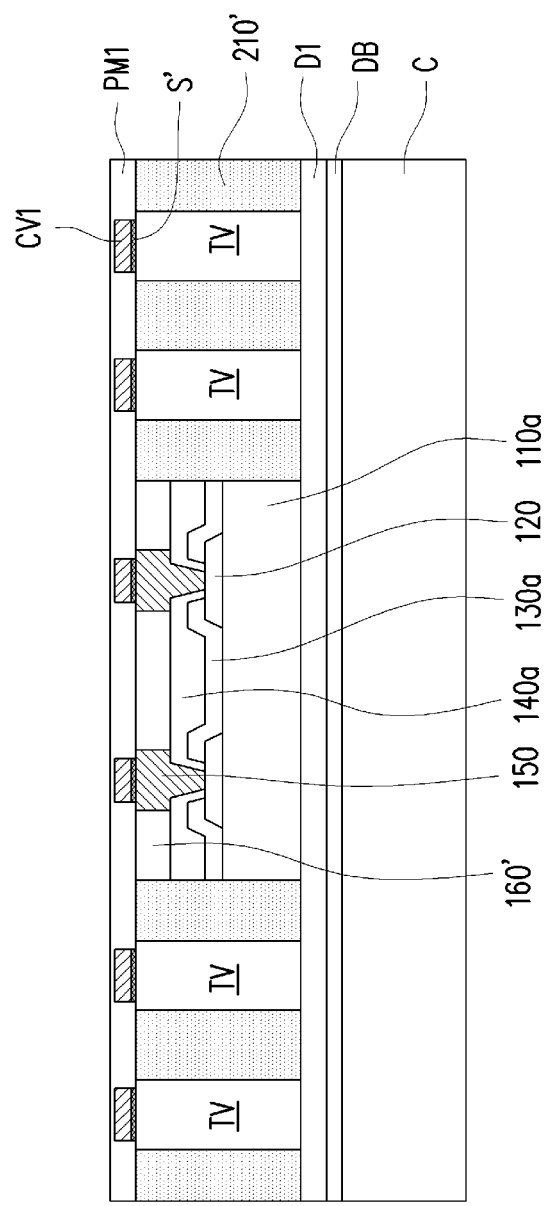
Figure 12:
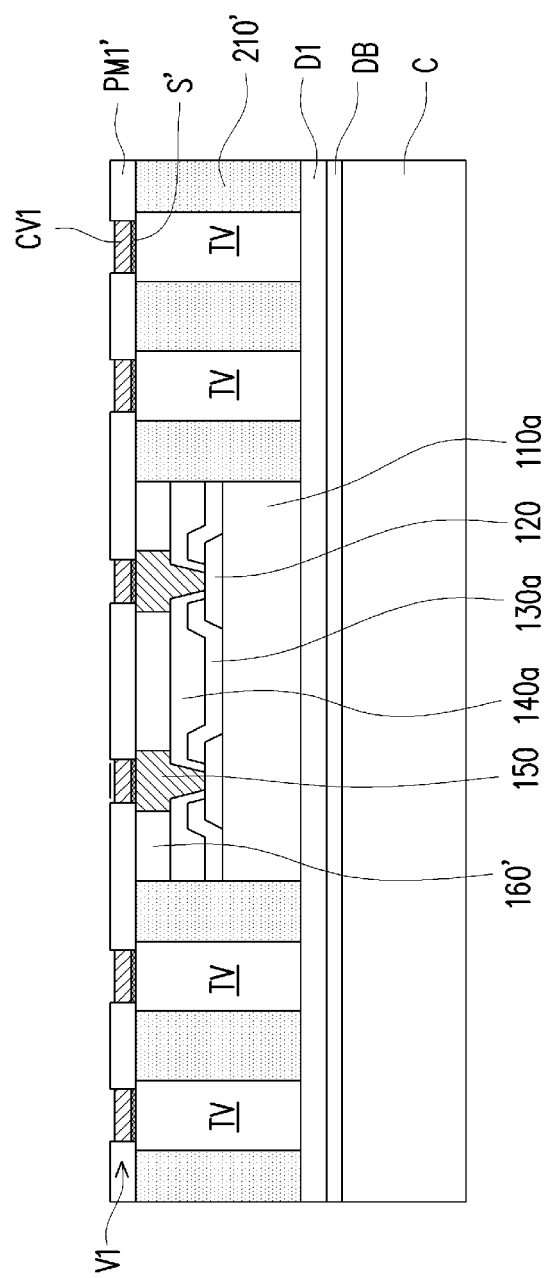

Referring to FIG. 11 and FIG. 12, a first dielectric layer PM1 (e.g., non-photosensitive dielectric material) is formed to cover the first conductive vias CV1 and the bottom patterned seed layer S'. A first polishing process is performed to polish the first dielectric layer PM1 such that a first polished dielectric layer PM1' with a reduced thickness is formed and top surfaces of the first conductive vias CV1 are exposed. The first polished dielectric layer PM1' includes a plurality of first via openings V1 and the first conductive vias CV1 are located in the first via openings V1. In some embodiments, the first dielectric layer PM1 is polished through a chemical mechanical polishing (CMP) process. During the front end of the first polishing process, a portion of the first dielectric layer PM1 is polished until the top surfaces of the first conductive vias CV1 are revealed; and during the back end of the first polishing process, the first dielectric layer PM1 and the first conductive vias CV1 are slightly over-polished. When the first dielectric layer PM1 and the first conductive vias CV1 are polished by the chemical mechanical polishing (CMP) process, the polishing slurry utilized in the chemical mechanical polishing (CMP) process may determine polishing rates of the first conductive vias CV1 and the first dielectric layer PM1. Due to the polishing rate selectivity of the first dielectric layer PM1 to the first conductive vias CV1, a first level height offset may generated between the top surfaces of the first conductive vias CV1 and the top surface of the first polished dielectric layer PM1' after performing the first polishing process. In some embodiments, the first level height offset may be about 0.1 micrometer to about 1 micrometer.

As shown in FIG. 12, a first polishing rate of the first conductive vias CV1 is greater than a second polishing rate of the first dielectric layer PM1 when performing the first polishing process. In other words, the first conductive vias CV1 are polished faster than the first dielectric layer PM1. Accordingly, the top surface of the first polished dielectric layer PM1' may be higher than the top surfaces of the first conductive vias CV1 due to the polishing rate selectivity of the first dielectric layer PM1 to the first conductive vias CV1.

Figure 13:
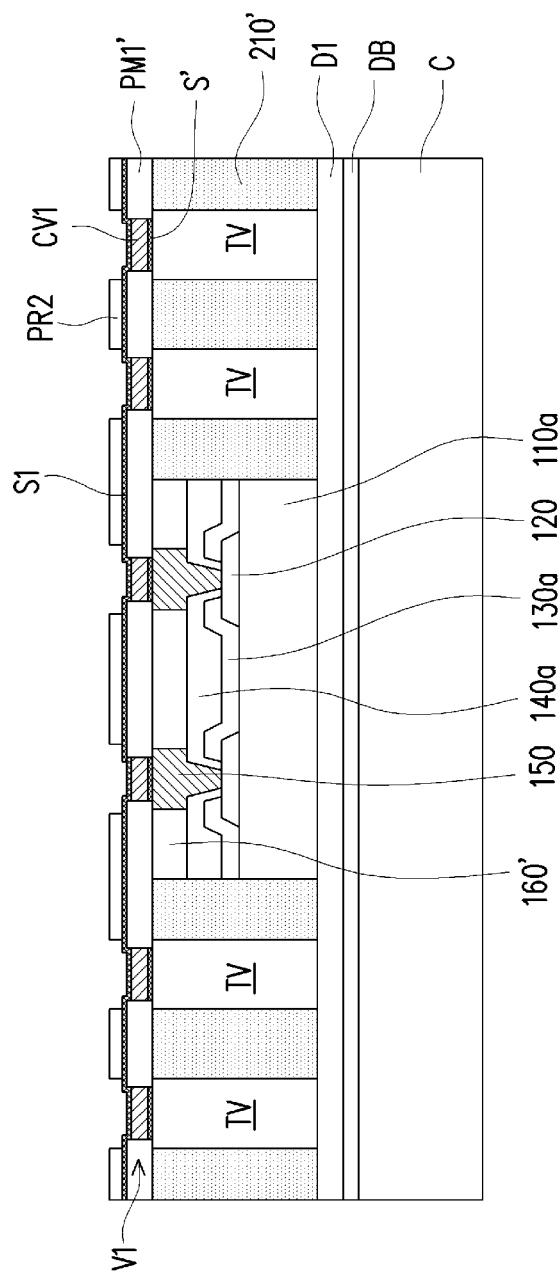

Referring to FIG. 13, a first seed layer S1 is conformally formed on the first conductive vias CV1 and the first polished dielectric layer PM1'. In some embodiments, the first seed layer S1 may be a titanium layer formed by a sputtering process and the thickness of the first seed layer S1 may be about 5 angstroms. A patterned photoresist layer PR2 is then formed over the first seed layer S1 through photolithography and development processes. The patterned photoresist layer PR2 includes a plurality of openings for exposing portions of the first seed layer S1 that are corresponding to the first conductive vias CV1.

Figure 14:
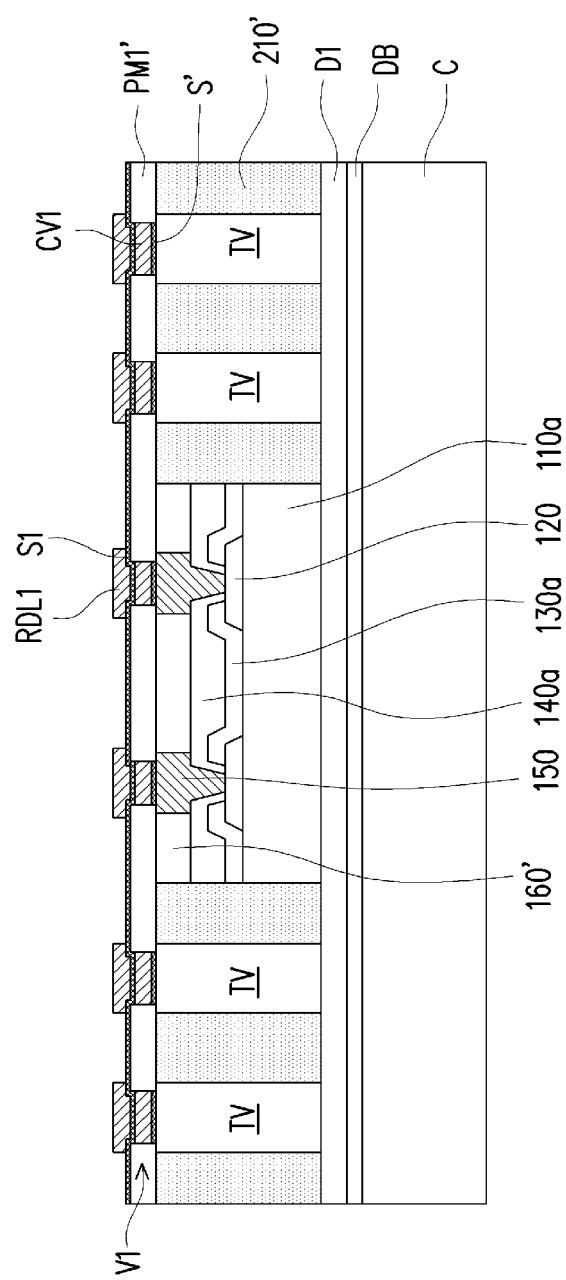

Referring to FIG. 13 and FIG. 14, a plating process is performed such that a plurality of first redistribution wirings RDL1 are formed in the openings defined in the patterned photoresist layer PR2 and are disposed on the first conductive via CV1 and a portion of the first polished dielectric layer PM1'. In some embodiments, the first redistribution wirings RDL1 may be copper traces. After the first redistribution wirings RDL1 are formed, the patterned photoresist layer PR2 is removed, as shown in FIG. 14.

Figure 15:
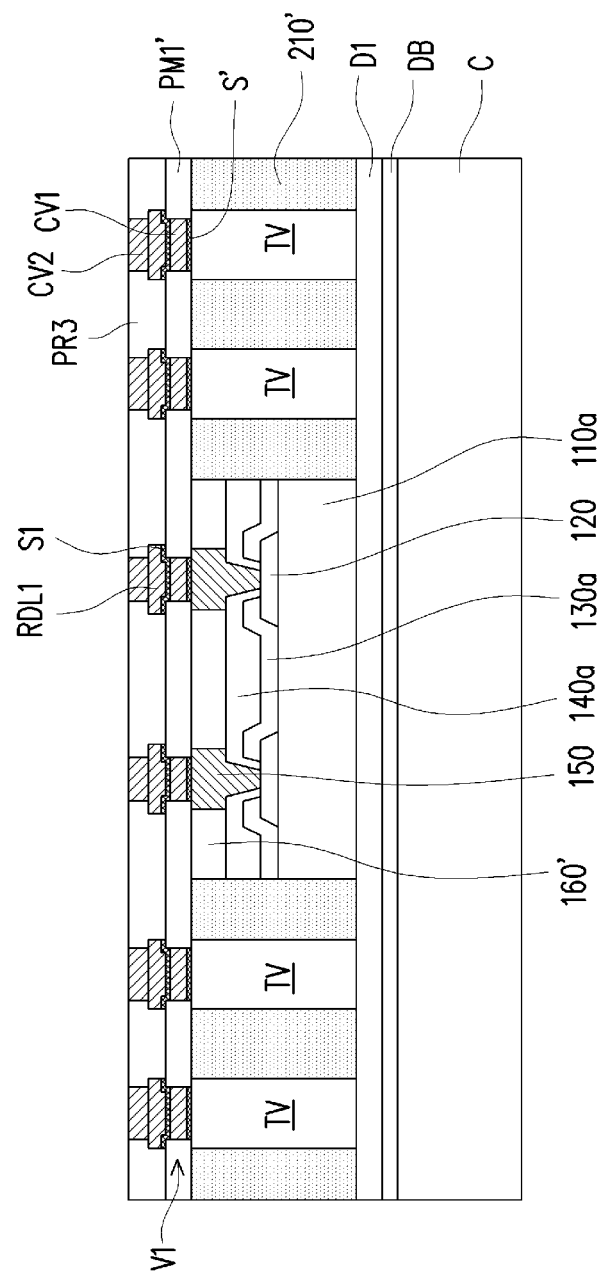

Referring to FIG. 15, after removing the patterned photoresist layer PR2, a patterned photoresist layer PR3 is formed on the first seed layer S1 so as to partially cover the first redistribution wirings RDL1. The patterned photoresist layer PR3 includes a plurality of openings for exposing the first redistribution wirings RDL1. A plating process is then performed such that a plurality of second conductive vias CV2 are formed on the first redistribution wirings RDL1 and formed in the openings defined in the patterned photoresist layer PR3. The second conductive vias CV2 are directly in contact with the first redistribution wirings RDL1. In other words, there is no seed layer formed between the second conductive vias CV2 and the first redistribution wirings RDL1. In some embodiments, the second conductive vias CV2 may be copper vias and the thickness of the second conductive vias CV2 may be about 20 angstroms. Since the patterned photoresist layer PR3 is formed through photolithography and development processes, the critical dimension of the openings defined in the patterned photoresist layer PR3 may be less than 5 micrometers. Accordingly, the critical dimension of the second conductive vias CV2 formed in the openings of the patterned photoresist layer PR3 may be less than 5 micrometers.

Figure 16:
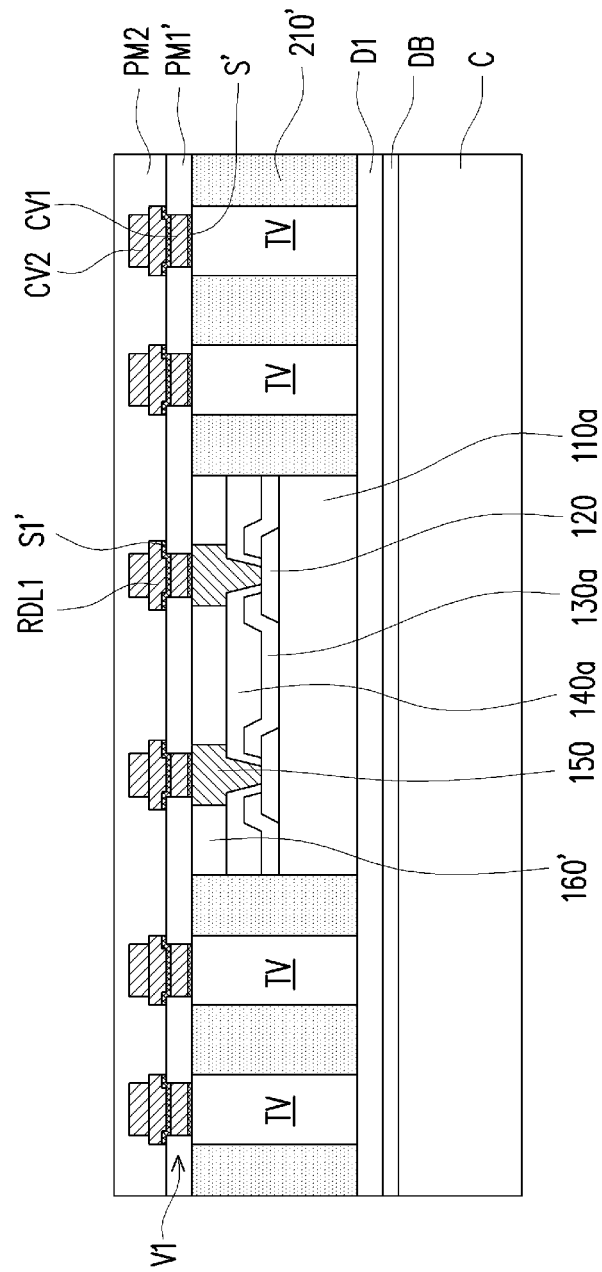

Referring to FIG. 15 and FIG. 16, after the second conductive vias CV2 are formed, the patterned photoresist layer PR3 is removed. Thereafter, by using the first redistribution wirings RDL1 as a hard mask, portions of the first seed layer S1 that are not covered by the first redistribution wirings RDL1 are removed such that a first patterned seed layer S1' covered by the first redistribution wirings RDL1 is formed on the first conductive vias CV1 and the first polished dielectric layer PM1'. In some embodiments, the first seed layer S1 may be patterned through an etch process so as to form the first patterned seed layer S1'. The first patterned seed layer S1' and the first redistribution wirings RDL1 are partially embedded in the first via openings V1 of the first polished dielectric layer PM1'.

As shown in FIG. 16, a second dielectric layer PM2 (e.g., non-photosensitive dielectric material) is formed on the first polished dielectric layer PM1' so as to cover the first patterned seed layer S1', the first redistribution wirings RDL1 and the second conductive vias CV2.

Figure 17:
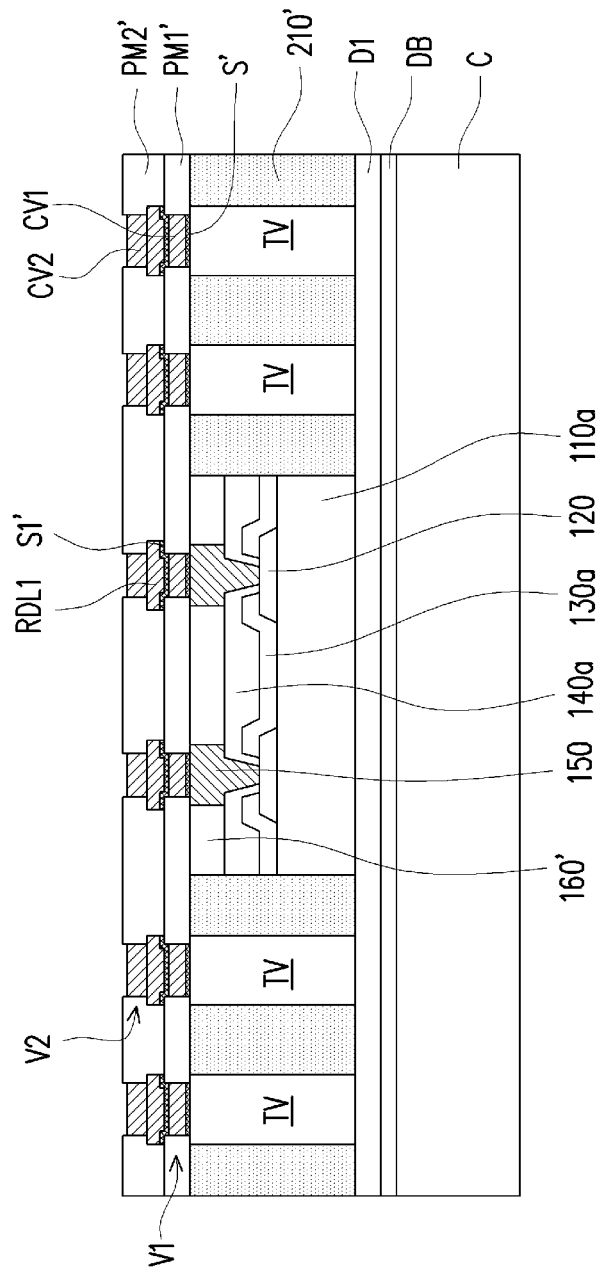

Referring to FIGS. 16 and 17, a second polishing process is performed to polish the second dielectric layer PM2 such that a second polished dielectric layer PM2' with a reduced thickness is formed and top surfaces of the second conductive vias CV2 are exposed. The second polished dielectric layer PM2' is disposed on the first polished dielectric layer PM1' and the first redistribution wirings RDL1. The second polished dielectric layer PM2' includes a plurality of second via openings V2, the second conductive vias CV2 are located in the second via openings V2, and the second conductive via CV2 is electrically connected to the first redistribution wirings RDL1 through the second via opening V2 of the second polished dielectric layer PM2'. In some embodiments, the second dielectric layer PM2 is polished through a chemical mechanical polishing (CMP) process. During the front end of the second polishing process, a portion of the second dielectric layer PM2 is polished until the top surfaces of the second conductive vias CV2 are revealed; and during the back end of the second polishing process, the second dielectric layer PM2 and the second conductive vias CV2 are slightly over-polished. When the second dielectric layer PM2 and the second conductive vias CV2 are polished by the chemical mechanical polishing (CMP) process, the polishing slurry utilized in the chemical mechanical polishing (CMP) process may determine polishing rates of the second conductive vias CV2 and the second dielectric layer PM2. Due to the polishing rate selectivity of the second dielectric layer PM2 to the second conductive vias CV2, a second level height offset may generated between the top surfaces of the second conductive vias CV2 and the top surface of the second polished dielectric layer PM2' after performing the second polishing process. In some embodiments, the second level height offset may be about 0.1 micrometer to about 1 micrometer.

As shown in FIG. 17, a third polishing rate of the second conductive vias CV2 is greater than a fourth polishing rate of the second dielectric layer PM2 when performing the second polishing process. In other words, the second conductive vias CV2 are polished faster than the second dielectric layer PM2. Accordingly, the top surface of the second polished dielectric layer PM2' may be higher than the top surfaces of the second conductive vias CV2 due to the polishing rate selectivity of the second dielectric layer PM2 to the second conductive vias CV2.

As shown in FIG. 17, a stacked via structure including the first conductive vias CV1, the first polished dielectric layer PM1', the second conductive vias CV2, the second polished dielectric layer PM2' and the first redistribution wirings RDL1 is substantially accomplished.

Figure 18:
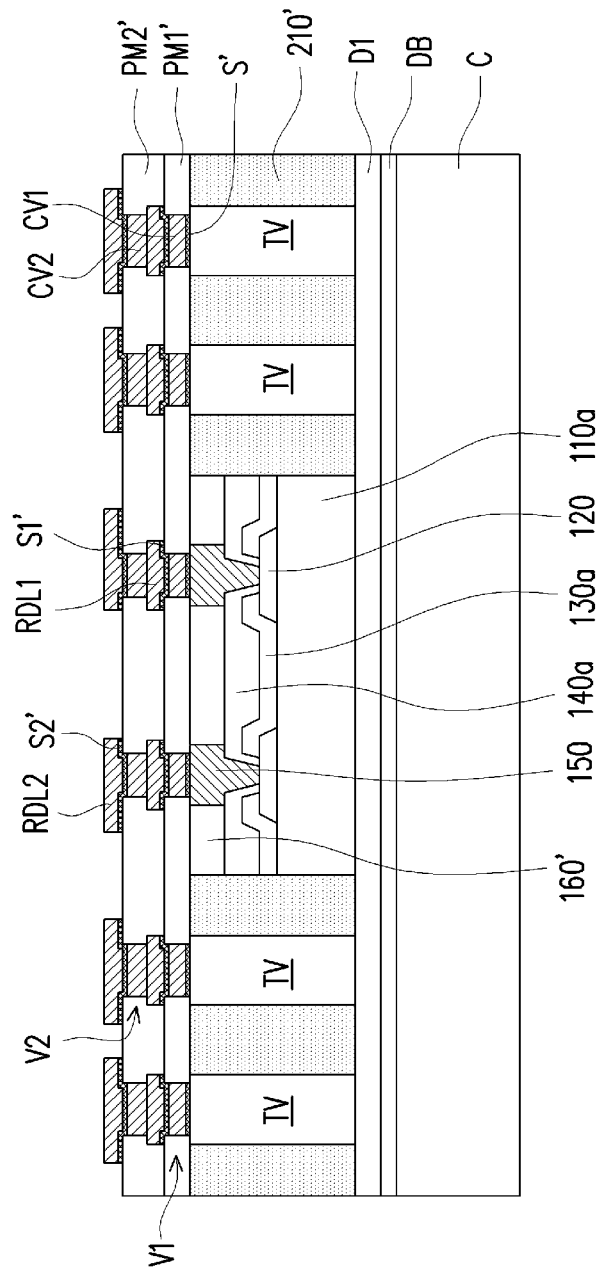

Referring to FIG. 18, a second patterned seed layer S2' and a second redistribution wirings RDL2 are formed on the second conductive via CV2 and a portion of the second dielectric layer PM2'. The forming processes of the second patterned seed layer S2' and the second redistribution wirings RDL2 are similar with the forming processes of the first patterned seed layer S1' and the first redistribution wirings RDL1 as illustrated in FIG. 13 and FIG. 14. The second patterned seed layer S2' and the second redistribution wirings RDL2 are partially embedded in the second via openings V2 of the second polished dielectric layer PM2'.

Figure 19:
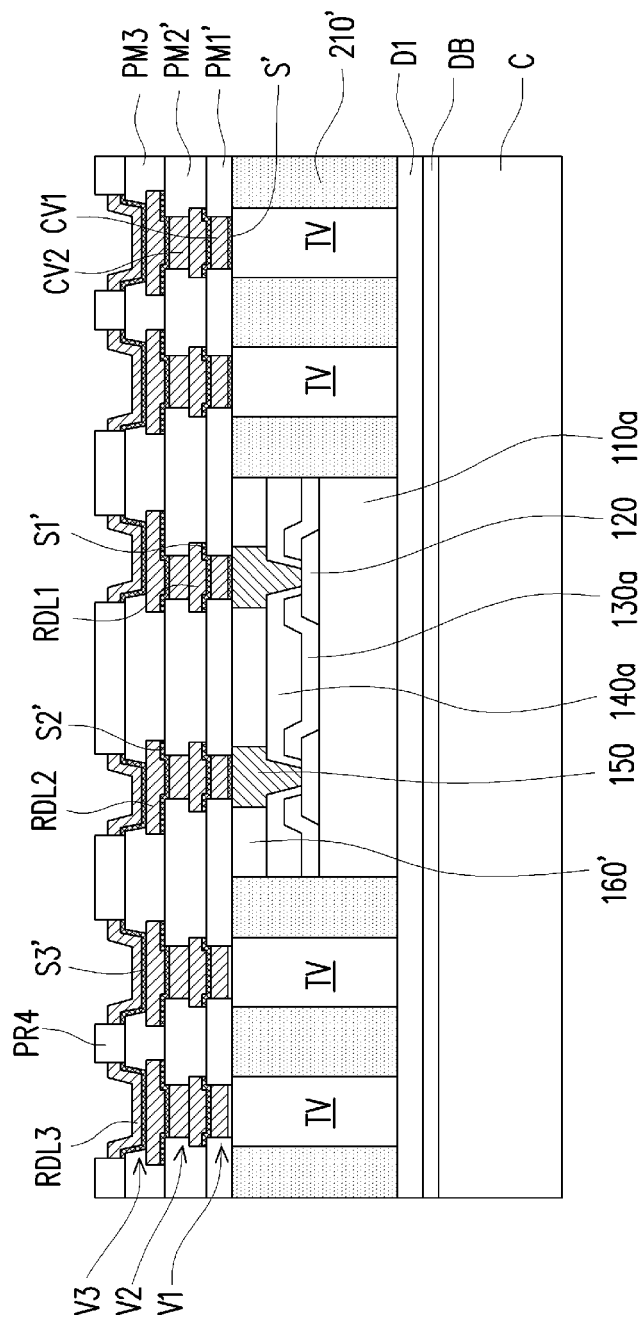

Referring to FIG. 19, a third dielectric layer PM3 having a plurality of third via openings V3 is formed on the second polished dielectric layer PM2' to cover portions of the second redistribution wirings RDL2. The second redistribution wirings RDL2 are exposed by the third via openings V3 defined in the third dielectric layer PM3. In some embodiments, the third dielectric layer PM3 may be photosensitive dielectric layer and may be patterned through photolithography and development processes so as to form the third via openings V3.

After forming the third dielectric layer PM3, a third seed layer S3 is conformally formed on the third dielectric layer PM3 and portions of the second redistribution wirings RDL2 exposed by the third via openings V3. Then, a patterned photoresist layer PR4 is formed on the third seed layer S3. The patterned photoresist layer PR4 includes a plurality of openings for exposing portions of the third seed layer S3. Thereafter, a plurality of third redistribution wirings RDL3 are formed in the openings defined in the patterned photoresist layer PR4. The third redistribution wirings RDL3 are formed on portions of the third seed layer S3 exposed by the openings of the patterned photoresist layer PR4.

It is noted that the critical dimension of the openings defined in the patterned photoresist layer PR4 may be substantially equal to or greater than 10 micrometers. Accordingly, the critical dimension of the third redistribution wirings RDL3 formed in the openings of the patterned photoresist layer PR4 may be substantially equal to or greater than 10 micrometers.

Figure 20:
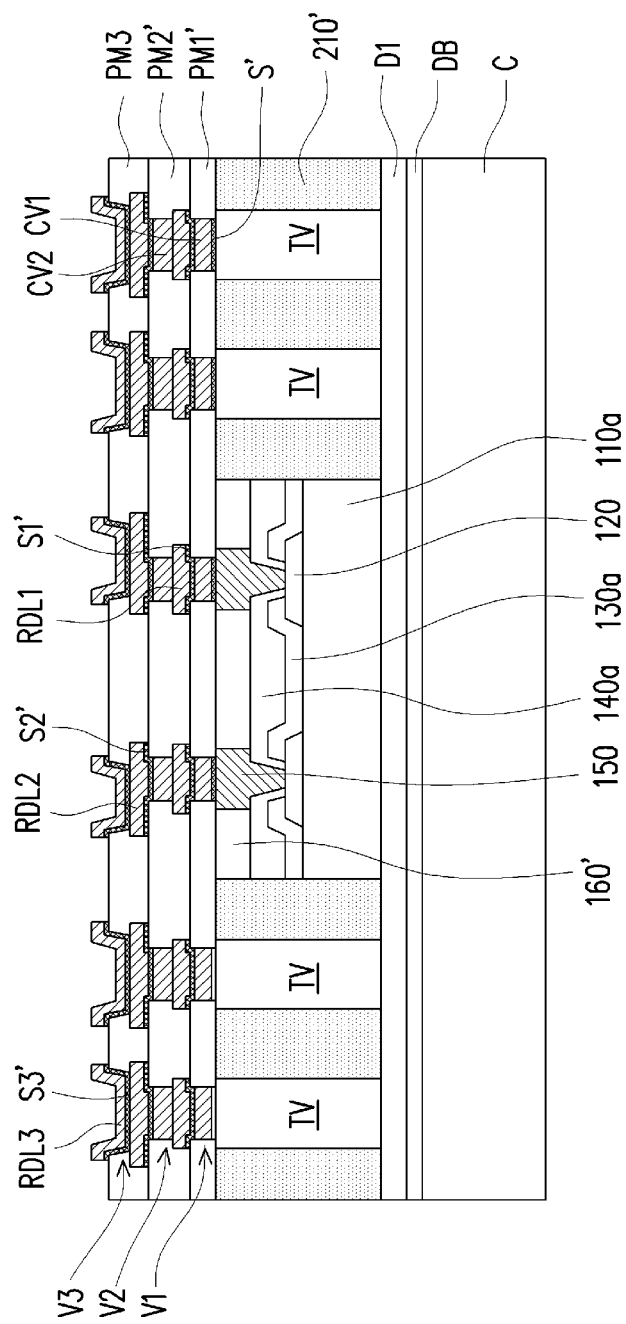

Referring to FIG. 20, after forming the third redistribution wirings RDL3, the patterned photoresist layer PR4 is removed. Thereafter, by using the third redistribution wirings RDL3 as a hard mask, portions of the third seed layer S3 that are not covered by the third redistribution wirings RDL3 are removed such that a third patterned seed layer S3' covered by the third redistribution wirings RDL3 is formed on the second redistribution wirings RDL and the third dielectric layer PM3. In some embodiments, the third seed layer S3 may be patterned through an etch process so as to form the third patterned seed layer S3'.

Figure 21:
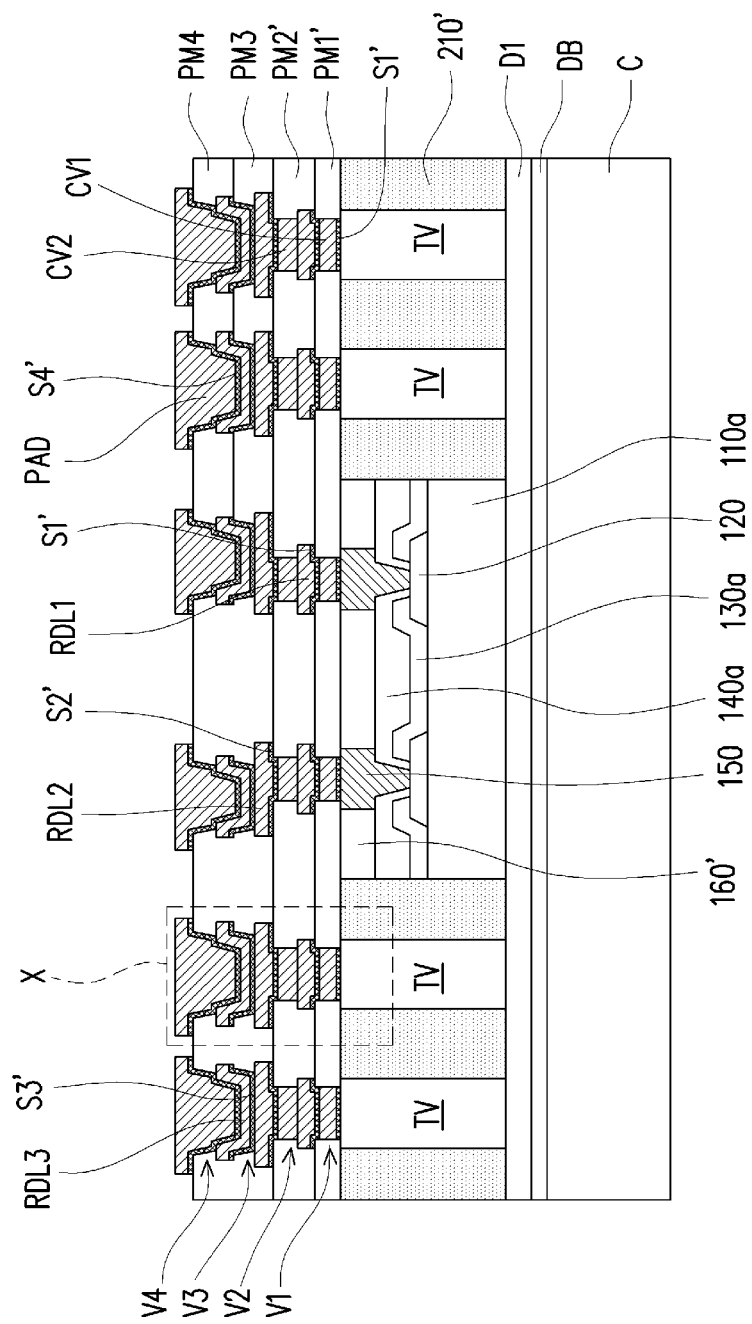

Referring to FIG. 21, a fourth patterned dielectric layer PM4, a fourth patterned seed layer S4' and pads PAD are formed on the third redistribution wirings RDL3 and a portion of the third dielectric layer PM3. The forming processes of the fourth patterned dielectric layer PM4 is similar with the forming processes of the third patterned dielectric layer PM3. The forming processes of the fourth patterned seed layer S4' and the pads PAD are similar with the forming processes of the third patterned seed layer S3' and the third redistribution wirings RDL3 as illustrated in FIG. 19 and FIG. 20.

As shown in FIG. 21, the fourth dielectric layer PM4 includes a plurality of fourth via openings V4 formed therein and the fourth via openings V4 expose the third redistribution wirings RDL3. Furthermore, the pads PAD are formed on the fourth dielectric layer PM4 and are electrically connected to the third redistribution wirings RDL3 through the fourth via openings V4 in the fourth dielectric layer PM4.

In some embodiments, the pads PAD may include a plurality of under-ball metallurgy (UBM) patterns for ball mount and a plurality of connection pads for mounting of passive components.

FIGS. 22 through 25 are enlarged views of region X illustrated in FIG. 21 in accordance with various embodiments of the present disclosure.

Figure 22:
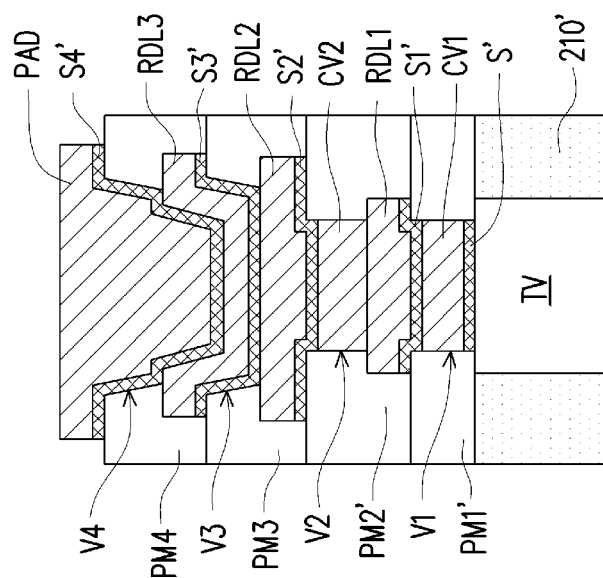
FIGS. 22 through 25 are enlarged views of region X illustrated in FIG. 21 in accordance with various embodiments of the present disclosure.

In the stacked via structure illustrated in FIG. 22, the top surface of the first polished dielectric layer PM1' is higher than the top surfaces of the first conductive vias CV1 due to the polishing rate selectivity of the first dielectric layer PM1 to the first conductive vias CV1; and the top surface of the second polished dielectric layer PM2' may be higher than the top surfaces of the second conductive vias CV2 due to the polishing rate selectivity of the second dielectric layer PM2 to the second conductive vias CV2. Furthermore, the first patterned seed layer S1' and the first redistribution wirings RDL1 are partially embedded in the first via openings V1 of the first polished dielectric layer PM1'; and the second patterned seed layer S2' and the second redistribution wirings RDL2 are partially embedded in the second via openings V2 of the second polished dielectric layer PM2'.

Figure 23:
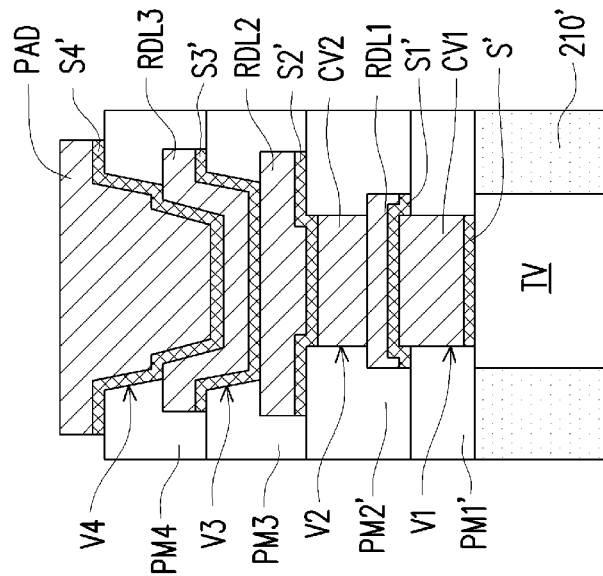

In the stacked via structure illustrated in FIG. 23, the top surface of the first polished dielectric layer PM1' is lower than the top surfaces of the first conductive vias CV1 due to the polishing rate selectivity of the first dielectric layer PM1 to the first conductive vias CV1 (i.e. the first conductive vias CV1 are polished slower than the first dielectric layer PM1'); and the top surface of the second polished dielectric layer PM2' may be higher than the top surfaces of the second conductive vias CV2 due to the polishing rate selectivity of the second dielectric layer PM2 to the second conductive vias CV2. Furthermore, the first conductive vias CV1 protrude from the top surface of the first polished dielectric layer PM1' and are partially embedded in the first redistribution wirings RDL1; and the second patterned seed layer S2' and the second redistribution wirings RDL2 are partially embedded in the second via openings V2 of the second polished dielectric layer PM2'.

Figure 24:
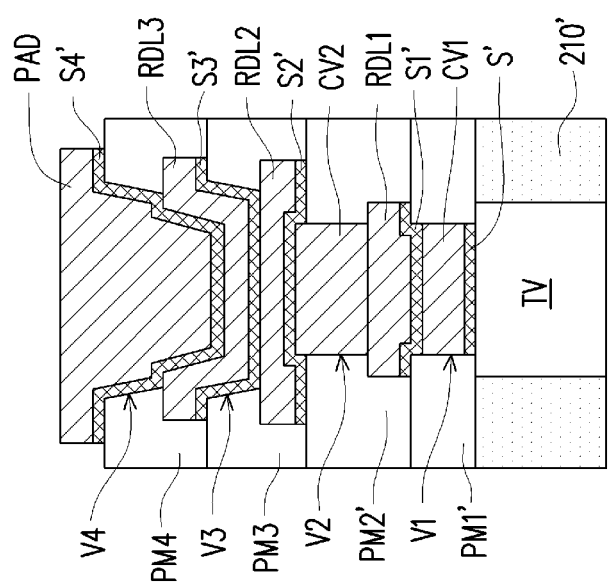

In the stacked via structure illustrated in FIG. 24, the top surface of the first polished dielectric layer PM1' is higher than the top surfaces of the first conductive vias CV1 due to the polishing rate selectivity of the first dielectric layer PM1 to the first conductive vias CV1; and the top surface of the second polished dielectric layer PM2' may be lower than the top surfaces of the second conductive vias CV2 due to the polishing rate selectivity of the second dielectric layer PM2 to the second conductive vias CV2. Furthermore, the first patterned seed layer S1' and the first redistribution wirings RDL1 are partially embedded in the first via openings V1 of the first polished dielectric layer PM1'; and the second conductive vias CV2 protrude from the top surface of the second polished dielectric layer PM2' and are partially embedded in the second redistribution wirings RDL2.

Figure 25:
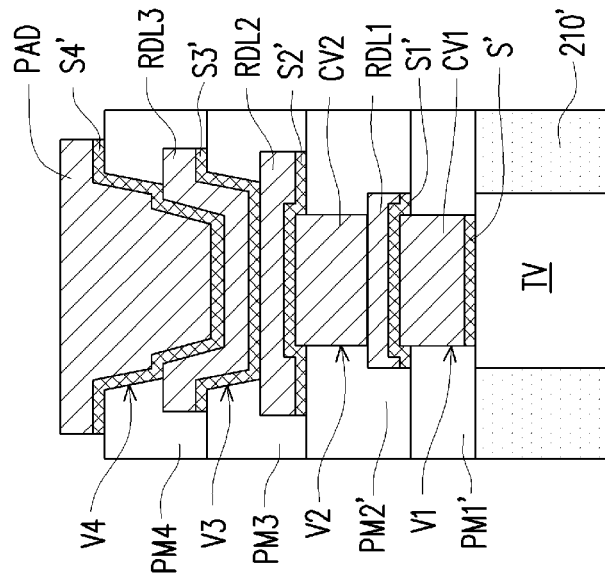

In the stacked via structure illustrated in FIG. 25, the top surface of the first polished dielectric layer PM1' is lower than the top surfaces of the first conductive vias CV1 due to the polishing rate selectivity of the first dielectric layer PM1 to the first conductive vias CV1; and the top surface of the second polished dielectric layer PM2' may be lower than the top surfaces of the second conductive vias CV2 due to the polishing rate selectivity of the second dielectric layer PM2 to the second conductive vias CV2. Furthermore, the first conductive vias CV1 protrude from the top surface of the first polished dielectric layer PM1' and are partially embedded in the first redistribution wirings RDL1; and the second conductive vias CV2 protrude from the top surface of the second polished dielectric layer PM2' and are partially embedded in the second redistribution wirings RDL2.

In the above-mentioned embodiments, the non-planar interfaces between the conductive vias and the redistribution wirings may enhance the structural strength of the stacked via structure.

In accordance with some embodiments of the disclosure, a stacked via structure including a first dielectric layer, a first conductive via, a first redistribution wiring, a second dielectric layer and a second conductive via is provided. The first dielectric layer includes a first via opening. The first conductive via is located in the first via opening. A first level height offset is between a top surface of the first conductive via and a top surface of the first dielectric layer. The first redistribution wiring covers the top surface of the first conductive via and the top surface of the first dielectric layer. The second dielectric layer is disposed on the first dielectric layer and the first redistribution wiring. The second dielectric layer includes a second via opening. The second conductive via is located in the second via opening. The second conductive via is electrically connected to the first redistribution wiring through the second via opening of the second dielectric layer.

In accordance with some embodiments of the disclosure, a stacked via structure including a first dielectric layer, a first conductive via, a first patterned seed layer, a first redistribution wiring, a second dielectric layer, a second conductive via, a second patterned seed layer and a second redistribution wiring is provided. The first dielectric layer includes a first via opening. The first conductive via is located in the first via opening. A first level height offset is between a top surface of the first conductive via and a top surface of the first dielectric layer. The first patterned seed layer covers the first conductive via and a portion of the first dielectric layer. The first redistribution wiring is disposed on first patterned seed layer. The second dielectric layer is disposed on the first dielectric layer and the first redistribution wiring. The second dielectric layer includes a second via opening. The second conductive via is located in the second via opening. The second conductive via is electrically connected to the first redistribution wiring through the second via opening of the second dielectric layer. A second level height offset is between a top surface of the second conductive via and a top surface of the second dielectric layer. The second patterned seed layer covers the second conductive via and a portion of the second dielectric layer. The second redistribution wiring is disposed on the second patterned seed layer.

In accordance with some embodiments of the disclosure, a method of fabricating a stacked via structure including the following steps. A first conductive via is formed; a first dielectric layer is formed to cover the first conductive via; a first polishing process is performed to polish the first dielectric layer to expose a top surface of the first conductive via, such that a first level height offset is between the top surface of the first conductive via and a top surface of the first dielectric layer after polishing the first dielectric layer; a first redistribution wiring is formed on the first conductive via and a portion of the first dielectric layer; a second conductive via is formed on the first redistribution wiring; a second dielectric layer is formed on the first dielectric layer to cover the second conductive via and the first redistribution wiring; and a second polishing process is performed to polish the second dielectric layer to expose a top surface of the second conductive via, such that a second level height offset being between the top surface of the second conductive vias and a top surface of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a semiconductor die laterally encapsulated by an insulating encapsulant;
a first dielectric layer disposed on the semiconductor die and the insulating encapsulant;
a first conductive via embedded in the first dielectric layer, wherein the first conductive via is disposed over and electrically connected to the semiconductor die;
a first patterned seed layer covering he first conductive via and a portion of the first dielectric layer, wherein the first dielectric layer is in direct contact with the semiconductor die, the insulating encapsulant and sidewalls of the first conductive via;
a first redistribution wiring disposed on the first patterned seed layer, wherein the first patterned seed layer is interposed between the first conductive via and the first redistribution wirings;
a second dielectric layer disposed over the first dielectric layer and the first redistribution wiring; and
a second conductive via disposed over the first redistribution wiring, the second conductive via being electrically connected to the first redistribution wiring, wherein a first angle between a top surface of the first conductive via and a sidewall of the first conductive via is less than a second angle between a top surface of the second conductive via and a sidewall of the second conductive via.

2. The structure as claimed in claim 1, wherein a first level height offset is presented between a top surface of the first conductive via and a top surface of the first dielectric layer.

3. The structure as claimed in claim 1 further comprising a third dielectric layer and a third conductive via embedded in the third dielectric layer, wherein a second level height offset is present between a top surface of the third conductive via and a top surface of the third dielectric layer.

4. The structure as claimed in claim 3, wherein the top surface of the first conductive via is lower than the top surface of the first dielectric layer.

5. The structure as claimed in claim 4, wherein the top surface of the third conductive via is higher than the top surface of the third dielectric layer.

6. The structure as claimed in claim 4, wherein the top surface of the third conductive via is lower than the top surface of the third dielectric layer.

7. The structure as claimed in claim 3, wherein the top surface of the first conductive via is higher than the top surface of the first dielectric layer.

8. The structure as claimed in claim 1 further comprising a bottom patterned seed layer covered by the first conductive via, wherein the bottom patterned seed layer is spaced apart from the first patterned seed layer by the first conductive via.

9. The structure as claimed in claim 1, wherein the first patterned seed layer is in direct contact with the first dielectric layer.

10. The structure as claimed in claim 1 further comprising a bottom patterned seed layer covered by the first conductive via, wherein the bottom patterned seed layer is between the first conductive via and the semiconductor die.

11. The structure as claimed in claim 1, wherein the first patterned seed layer and sidewalls of the first conductive via are in contact with the first dielectric layer.

12. A structure, comprising:
a semiconductor die laterally encapsulated by an insulating encapsulant;
a first dielectric layer in direct contact with the semiconductor die and the insulating encapsulant;
a bottom patterned seed layer disposed on the semiconductor die and embedded in the first dielectric layer, wherein the bottom patterned seed layer is spaced apart from a top surface of the first dielectric layer;
a first conductive via disposed on the bottom patterned seed layer and embedded in the first dielectric layer, wherein sidewalls of the first conductive via are in direct contact with the first dielectric layer, and wherein the bottom patterned seed layer and the first conductive via are located above and electrically connected to the semiconductor die;
a first patterned seed layer covering the first conductive via;
a first redistribution wiring disposed on the first patterned seed layer;
a second dielectric layer disposed over the first dielectric layer and the first redistribution wiring; and
a second conductive via disposed over the first redistribution wiring, the second conductive via being electrically connected to the first redistribution wiring, wherein a first angle between a top surface of the first conductive via and a sidewall of the first conductive via is less than a second angle between a top surface of the second conductive via and a sidewall of the second conductive via.

13. The structure as claimed in claim 12, wherein a first level height offset is presented between a top surface of the first conductive via and a top surface of the first dielectric layer.

14. The structure as claimed in claim 12 further comprising a third dielectric layer and a third conductive via embedded in the third dielectric layer, wherein a second level height offset is present between a top surface of the third conductive via and a top surface of the third dielectric layer.

15. The structure as claimed in claim 14, wherein the top surface of the first conductive via is lower than the top surface of the first dielectric layer.

16. The structure as claimed in claim 15, wherein the top surface of the third conductive via is higher than or lower than the top surface of the third dielectric layer.

17. The structure as claimed in claim 14, wherein the top surface of the first conductive via is higher than the top surface of the first dielectric layer.

18. The structure as claimed in claim 17, wherein the top surface of the third conductive via is higher than or lower than the top surface of the third dielectric layer.

19. A structure, comprising:
   a semiconductor die laterally encapsulated by an insulating encapsulant;
   a first dielectric layer in direct contact with conductive pillars of the semiconductor die and the insulating encapsulant;
   a bottom patterned seed layer disposed on the conductive pillars of the semiconductor die and embedded in the first dielectric layer;
   a first conductive via disposed on the bottom patterned seed layer and embedded in the first dielectric layer, wherein sidewalls of the first conductive via are in direct contact with the first dielectric layer, and wherein the first conductive via is located above the conductive pillars of the semiconductor die;
   a first patterned seed layer disposed on the first conductive via, wherein the first patterned seed layer, the first conductive via and the bottom patterned seed layer are in contact with the first dielectric layer;
   a first redistribution wiring disposed on the first patterned seed layer;
   a second dielectric layer disposed over the first dielectric layer and the first redistribution wiring; and
   a second conductive via disposed over the first redistribution wiring, the second conductive via being electrically connected to the first redistribution wiring, wherein a first angle between a top surface of the first conductive via and a sidewall of the first conductive via is less than a second angle between a top surface of the second conductive via and a sidewall of the second conductive via.

20. The structure as claimed in claim 19, wherein the first patterned seed layer is spaced apart from the bottom patterned seed layer.

* * * * *